United States Patent

Edwards et al.

[11] Patent Number: 5,952,858
[45] Date of Patent: Sep. 14, 1999

[54] JUNCTION CAPACITOR COMPENSATION FOR WAVE SHAPING

[75] Inventors: William Ernest Edwards, Ann Arbor; Joseph Notaro, Northville, both of Mich.

[73] Assignee: STMicroelectronics, Inc., Carrollton, Tex.

[21] Appl. No.: 08/787,976

[22] Filed: Jan. 23, 1997

[51] Int. Cl.[6] .................................................. H03K 5/01
[52] U.S. Cl. ........................................ 327/169; 327/194
[58] Field of Search .................................. 327/103, 164, 327/169, 189, 194–196, 291, 302, 314, 320, 325–326, 502–504, 584, 585, 586, 133, 134, 514

[56] References Cited

U.S. PATENT DOCUMENTS

| | | | |
|---|---|---|---|
| 3,676,697 | 7/1972 | Davenport | 327/134 |
| 3,731,232 | 5/1973 | Hekimian | 327/134 |
| 5,578,815 | 11/1996 | Nakase et al. | 250/214 R |
| 5,642,067 | 6/1997 | Grace | 327/134 |

FOREIGN PATENT DOCUMENTS 1667226  7/1991  U.S.S.R. .................................. 327/169

*Primary Examiner*—My-Trang Nu Ton
*Attorney, Agent, or Firm*—Theodore E. Galanthay; Lisa K. Jorgenson; Renee M. Larson

[57] ABSTRACT

A method and structure for wave-shaping of digital waveforms of integrated circuit processes that do not have area efficient dielectric capacitors is disclosed. The dielectric capacitors of the prior art are replaced with a first, linearizing diode and a second diode of a wave-shaping circuit, each diode having a junction capacitance that varies with voltage applied across the diode. The first, linearizing diode is supplied with a constant current from a constant current source. A current inversely proportional to the junction capacitance of the first, linearizing diode is produced at a node defined as the connection between the constant current source and the first linearizing diode. The current at the node is supplied to the second diode to produce an output voltage of the wave-shaping circuit that is linear with respect to time.

16 Claims, 2 Drawing Sheets

JUNCTION CAPACITOR COMPENSATION FOR WAVE SHAPING

BACKGROUND OF THE INVENTION

The present invention relates generally to wave-shaping circuits, and more specifically to wave-shaping circuits for simple integrated circuit (IC) processes, such as MOS (Metal Oxide Silicon) and MIM (Metal Insulated Metal), that do not have area efficient dielectric capacitors.

According to classical electrical theory the high frequency content of an electrical waveform is related to the time-varying nature of the waveform. In particular, fast changes in waveform amplitude are indicative of increased high frequency content. It is well known that a square wave representation, for example, becomes more accurate as the number of high frequency harmonics included in the representation is increased. An infinite number of harmonics would be required to perfectly represent a square wave. Modern digital devices typically utilize square waves and rectangular waveforms, which have similar characteristics.

Increased high frequency content of an electrical waveform can cause problems in electrical circuits and systems. While higher frequency content of an electrical waveform may do no harm in the circuit utilizing the waveform if rise and fall times are faster than required, it is well known in the art that high frequency signals emit electromagnetic radiation that can couple into adjoining circuits and equipments causing problems such as mis-triggering. For example, a tunable radio receiver in proximity to an operating computer can easily detect the existence of many frequencies utilized in the computer and harmonics of those frequencies. It is thus possible and in fact commonplace for digital devices to interfere with wireless communications.

A number of approaches may be used to reduce the magnitude of this problem. Shielding of higher frequency circuitry is common, wherein metallic barriers to electromagnetic radiation are erected in an attempt to contain the radiation in a restricted volume. Electrical filtering is commonplace, seeking to reduce the high frequency content on signal paths entering or leaving an area containing circuitry or equipment which contain high frequency signals. Shielding and filtering of an area which will be adversely affected by coupled electromagnetic radiation is also commonplace. At a higher level, government agencies often put quantitative restrictions on the level of high frequencies which may be radiated or conducted from a given equipment. All of the above solutions, however, are only successful to varying degrees and add size and cost. It is well known in the art that it is better to not generate high frequencies unless they are required.

If the instantaneous amplitude changes in a perfect square wave are replaced by amplitude changes that occur over a finite time, the higher frequency harmonics can be greatly reduced. The higher frequency harmonic content can be minimized if the fast amplitude changes which occur at the edges of a square wave are replaced by amplitude changes which exhibit a constant time rate of change, and if the remaining corners are rounded off. It is clear that digital circuits require rectangular waveforms which change sufficiently fast so as to obtain the required operation, but it is not normally required that these waveforms be excessively faster than this. It is therefore understood in the art that the rise and fall times generated in digital circuitry may be increased and the corners may be rounded as long as one remains within the bounds of good engineering practice.

The above modification to the rise and fall times of a rectangular waveform is referred to as wave-shaping and is shown in FIG. 1. Wave-shaping may be applied at any physical level of electrical circuitry, such as with discrete components or within integrated circuits. Typically the constant slew rate referred to above is achieved in integrated circuits by charging an on-chip capacitor C1 with a constant current source l as shown in FIG. 2. The voltage is integrated on the capacitor at a constant rate, l=CdV/dT, where l is the fixed current, C is the value of the capacitor, and dV/dT is the slew rate or fixed slope of the capacitor voltage as a function of time. The high frequency content of the shaped waveform is significantly less using wave-shaping.

The remaining wave-shaping step, called edge rounding, is achieved by integrating the constant slew rate onto a second capacitor C2. In a CMOS (Complementary Metal Oxide Silicon) process, a MOS (Metal Oxide Silicon) capacitor can be used because of the relatively high specific capacitance available with good temperature stability and matching.

The wave-shaping process described above is well known in prior art, but it is not appropriate for realizing wave-shaping in simple IC processes that do not have area efficient dielectric capacitors (MOS or MIS). Inexpensive bipolar processes frequently have only junction capacitors which are area efficient but have large temperature and voltage coefficients which result in unacceptable shifting of operational characteristics.

There is thus an unmet need in the art to be able to incorporate stable wave-shaping characteristics into inexpensive bipolar IC processes. Therefore, it would be advantageous in the art to be able to teach a method for wave-shaping which is compatible with the inexpensive bipolar IC processes currently in use.

SUMMARY OF THE INVENTION

A method and structure for wave-shaping of digital waveforms of integrated circuit processes that do not have area efficient dielectric capacitors is disclosed. The dielectric capacitors of the prior art are replaced with a first, linearizing diode and a second diode of a wave-shaping circuit, each diode having a junction capacitance that varies with voltage applied across the diode. The first, linearizing diode is supplied with a constant current from a constant current source. A current inversely proportional to the junction capacitance of the first, linearizing diode is produced by a transconductance amplifier supplied with a linear voltage at a node defined as the connection between the constant current source and the first linearizing diode. The current at the node is supplied to the second diode to produce an output voltage of the wave-shaping circuit that is linear with respect to time. The output voltage of the wave-shaping circuit has a constant slew rate that compensates for any process and temperature variations in the first, linearizing diode and the second diode. The constant current supplied to the linearizing diode may be varied to produce desired controlled corner rounding.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawing(s), wherein:

DESCRIPTION OF THE INVENTION

Wave-shaping of rectangular digital waveforms is often required to reduce the amount of high frequency content in these signals since electromagnetic radiation and conduction of high frequency energy is known to produce interference to other circuitry and equipment, often with disastrous results. A number of wave-shaping techniques are known in the art, but in the area of inexpensive bipolar IC processes there still exists a need for a simple wave-shaping technique which is compatible with the required IC production processes.

Figure 1A:
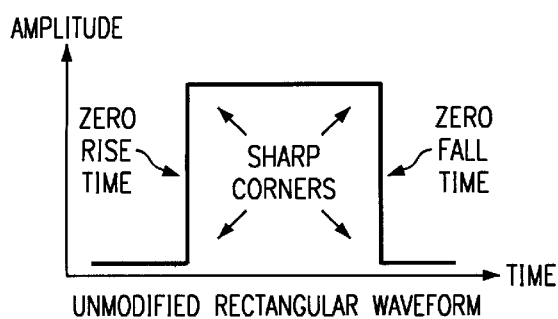
FIG. 1 is a Graph depicting the Wave-shaping of a Rectangular Waveform, according to the prior art.
Figure 1B:
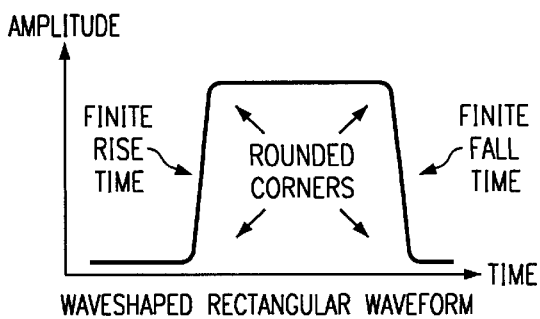
Figure 2A:
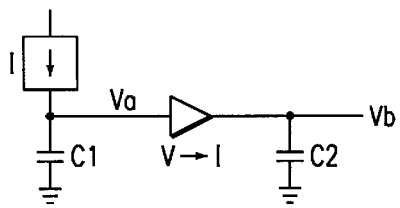
FIG. 2 is a Schematic Diagram and Graph representative of a Wave-shaping Technique according to the prior art.
Figure 2B:
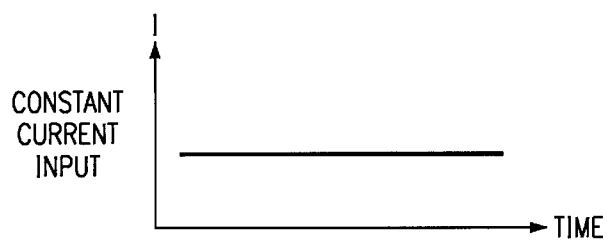
Figure 2C:
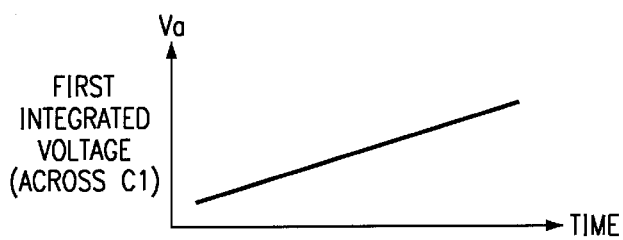
Figure 2D:
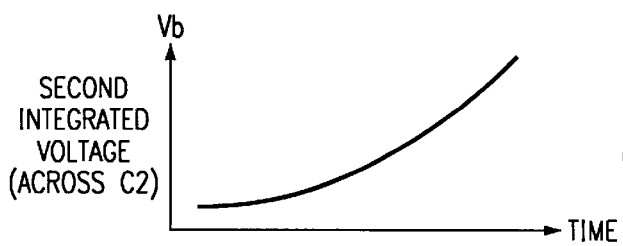
Figure 3A:
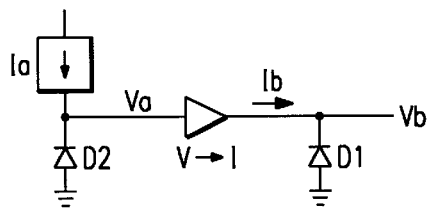
FIG. 3 is a Schematic Diagram and Graph representative of the Wave-shaping Technique according to the present invention.
Figure 3B:
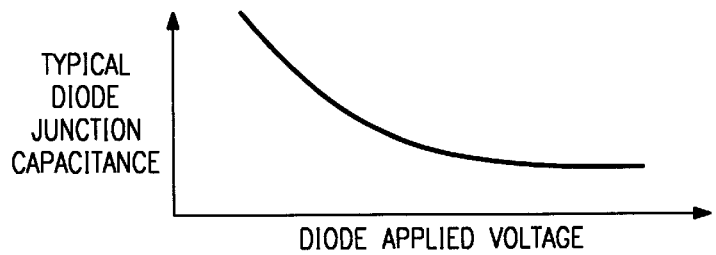
Figure 3C:
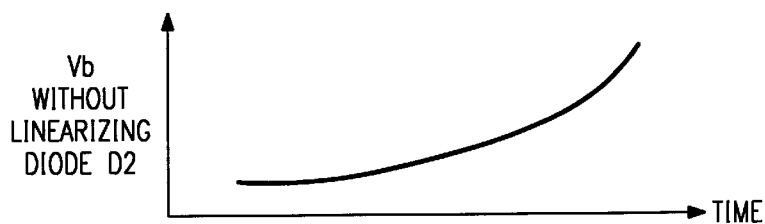
Figure 3D:
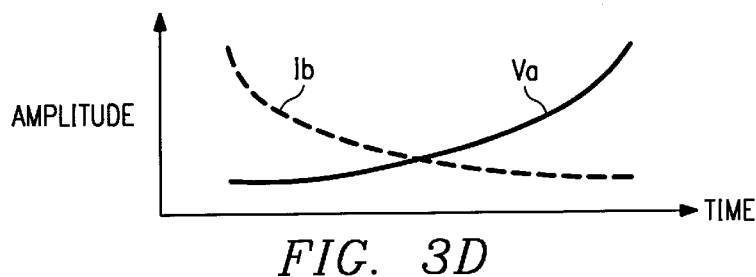
Figure 3E:
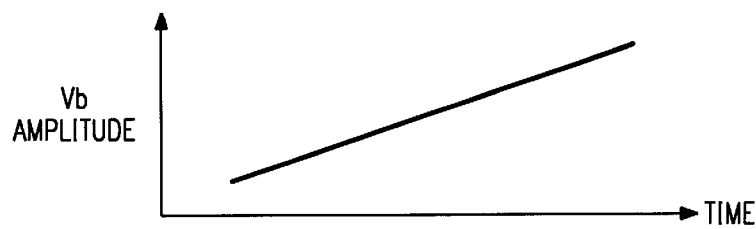

Referring to FIG. 3, a wave-shaping schematic (A) is presented which utilizes the junction capacitance of diodes D1 and D2 to replace the capacitors C2 and C1 in the prior art technique of FIG. 2. Waveform B illustrates the basic manner in which diode junction capacitance varies with voltage applied across the diode, and waveform C illustrates the manner in which Vb would vary versus time if diode D2 were a fixed capacitor, as in the prior art. Waveform D shows how the voltage Va and the current Ib, which is inversely proportional to the junction capacitance of D2, are related. Since the junction capacitance of D1 varies in the same manner as D2 with applied voltage, the overall output Vb will be linear with respect to time (waveform E).

A natural consequence and a novel feature of the present invention is that output Vb automatically compensates for process and temperature variations in the characteristics of the diodes D1 and D2. Instead of charging D1 with a linear current, the linear current is transformed by the junction capacitor of diode D2 and the transconductance amplifier to have a transfer function characteristic that is inverse to that of diode D1. This transfer function sets the ratio of D1 charging current to integrating capacitance to a constant, which produces the desired effect of a fixed slew rate output voltage Vb that is independent of process and temperature variations. For example, for a given Ia and with a change in junction capacitance of D2 due to temperature or process variations, voltage Va will change value. This changed value of Va will produce a change in current Ib which, when applied to charge the junction capacitance of D1 (the capacitance of D1 changes in a manner identical to D2), produces a compensating effect that tends to force Vb to remain constant. The circuit of the present invention will also respond to modifications in the shape of Ia, and such modifications could be designed by those proficient in the art to produce controlled corner rounding of output Vb.

The present invention teaches a practical method whereby a wave-shaping function may be implemented within the process requirements used for certain classes of bipolar integrated circuits. Two diodes are utilized, and voltage and temperature coefficients of the diodes are linearized in the present invention. The constant current input to the circuit of the present invention may be varied to produce controlled corner rounding by one skilled in the art. The present invention overcomes prior art limitations to allow wave-shaping functions to be integrated in simple bipolar processes.

While the invention has been particularly shown and described with reference to a preferred embodiment, it will be understood by those skilled in the art that various changes in form and detail may be made therein without departing from the spirit and scope of the invention.

What is claimed is:

1. A method of wave-shaping rectangular digital waveforms for integrated circuit processes that do not have area efficient dielectric capacitors, comprising the steps of:

supplying a linearizing reverse biased diode of a wave-shaping circuit that has a junction capacitance that varies with voltage applied across the linearizing reverse biased diode with a constant current produced by a constant current source of the wave-shaping circuit, wherein the linearizing reverse biased diode does not operate in a breakdown mode;

producing a current inversely proportional to a voltage applied across the linearizing reverse biased diode;

supplying the current inversely proportional to the voltage across the linearizing reverse biased diode to a reverse biased diode that has a junction capacitance that varies with voltage applied across the reverse biased diode; and producing an output voltage of the wave-shaping circuit that is linear with respect to time.

2. The method of claim 1, wherein the step of producing a current inversely proportional to the voltage across the linearizing reverse biased diode is accomplished by a transconductance amplifier of the wave-shaping circuit that is supplied with a linear voltage.

3. The method of claim 1, wherein the output voltage of the wave-shaping circuit has a constant slew rate that compensates for any process and temperature variations in the reverse biased diode and the linearizing reverse biased diode.

4. The method of claim 1, wherein the constant current supplied to the linearizing reverse biased diode may be varied to produce a desired controlled corner rounding.

5. A wave-shaping circuit of an integrated circuit process that does not have area efficient dielectric capacitors, comprising:

a constant current source;

a linearizing reverse biased diode having a junction capacitance that varies with voltage applied across the linearizing reverse biased diode, wherein the linearizing reverse biased diode does not operate in a breakdown mode;

a transconductance amplifier, supplied with a linear voltage at a first node defined as the connection of the linearizing, reverse biased diode and the constant current source and producing a current inversely proportional to the voltage applied across the linearizing reverse biased diode;

a reverse biased diode having a junction capacitance that varies with voltage applied across the linearizing reverse biased diode, wherein the reverse biased diode receives the current produced by the transconductance amplifier and is connected to a second node defined as the connection of the transconductance amplifier and the reverse biased diode;

wherein an output voltage of the wave-shaping circuit at the second node is linear with respect to time.

6. The circuit of claim 5, wherein the output voltage of the wave-shaping circuit has a constant slew rate that compensates for any process and temperature variations in the reverse biased diode and the linearizing reverse biased diode.

7. The circuit of claim 5, wherein the constant current source may be varied to produce a desired controlled corner rounding.

8. The circuit of claim 5, wherein the integrated circuit process is a bipolar process.

9. The circuit of claim 5, wherein the integrated circuit process is a Metal Oxide Silicon process.

10. The circuit of claim 5, wherein the integrated circuit process is a Metal Insulated Metal process.

11. A wave-shaping circuit of an integrated circuit process that does not have area efficient dielectric capacitors, comprising:

a constant current source;

a linearizing, reverse biased element having a capacitance that varies with voltage applied across the linearizing, reverse biased element, wherein the linearizing, reverse biased element does not operate in a breakdown mode;

an amplifier element, supplied with a linear voltage at a first node defined as the connection of the linearizing element and the constant current source and producing a current inversely proportional to a voltage applied across the linearizing, reverse biased element;

a reverse biased diode having a junction capacitance that varies with voltage applied across the linearizing, reverse biased element, wherein the reverse biased diode receives the current produced by the amplifier element and is connected to a second node defined as the connection of the amplifier element and the reverse biased diode;

wherein an output voltage of the wave-shaping circuit at the second node is linear with respect to time.

12. The circuit of claim 11, wherein the output voltage of the wave-shaping circuit has a constant slew rate that compensates for any process and temperature variations in the reverse biased diode and the linearizing, reverse biased element.

13. The circuit of claim 11, wherein the constant current source may be varied to produce a desired controlled corner rounding.

14. The circuit of claim 11, wherein the integrated circuit process is a bipolar process.

15. The circuit of claim 11, wherein the integrated circuit process is a Metal Oxide Silicon process.

16. The circuit of claim 11, wherein the integrated circuit process is a Metal Insulated Metal process.

* * * * *